United States Patent [19]

Solstad et al.

[11] Patent Number: 4,713,611
[45] Date of Patent: Dec. 15, 1987

[54] BURN-IN APPARATUS FOR INTEGRATED CIRCUITS MOUNTED ON A CARRIER TAPE

[75] Inventors: Russell V. Solstad, St. Paul; Millard Scott, New Hope; William Holliday, Bloomington, all of Minn.

[73] Assignee: VTC Incorporated, Bloomington, Minn.

[21] Appl. No.: 877,536

[22] Filed: Jun. 23, 1986

[51] Int. Cl.⁴ ............................................. G01R 35/00
[52] U.S. Cl. .................................................. 324/158 F
[58] Field of Search ................. 73/865.6, 865.8, 432.1, 73/866.5; 324/158 R, 158 D, 158 F, 158 T, 73 R, 73 PL; 361/399, 403, 408

[56] References Cited

U.S. PATENT DOCUMENTS

| | | | |
|---|---|---|---|
| 3,391,383 | 7/1968 | Antes | 324/158 F |
| 3,939,381 | 2/1976 | Meany | 361/402 |
| 4,324,040 | 4/1982 | Gottlieb | 324/158 F |
| 4,380,042 | 4/1983 | Angelucci, Sr. et al. | 361/408 |
| 4,386,389 | 5/1983 | Proebsting | 361/414 |

FOREIGN PATENT DOCUMENTS

| | | | |
|---|---|---|---|
| 0075658 | 6/1980 | Japan | 324/158 F |
| 0119071 | 9/1980 | Japan | 324/158 F |
| 0134366 | 10/1980 | Japan | 324/158 F |
| 0114866 | 7/1982 | Japan | 324/158 F |
| 0206781 | 11/1984 | Japan | 324/158 R |
| 0917137 | 4/1982 | U.S.S.R. | 324/158 F |

*Primary Examiner*—Michael J. Tokar
*Assistant Examiner*—Robert A. Raevis
*Attorney, Agent, or Firm*—Kinney & Lange

[57] ABSTRACT

An apparatus for electrically and thermally "burning in" a plurality of integrated circuits mounted on a carrier tape includes a printed circuit board base and a pair of covers. The printed circuit board base includes a plurality of contact arrays arranged and constructed to contact the leads from the integrated circuits mounted on the tape. The pair of covers are pivotally connected to the printed circuit board base. The covers include a corresponding number of pressure pads which force contact between integrated circuit leads and a contact array when a cover is in its closed position. A locking assembly is provided to keep the covers locked in their closed positions. The printed circuit board base also carries circuitry for electrically exercising the integrated circuits during burn-in.

11 Claims, 9 Drawing Figures

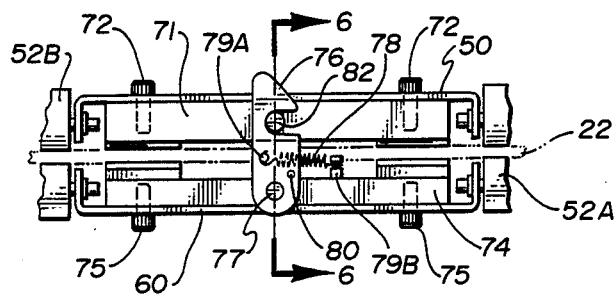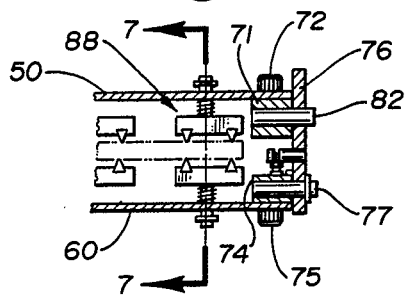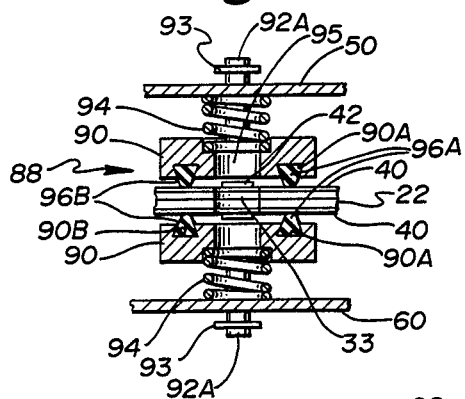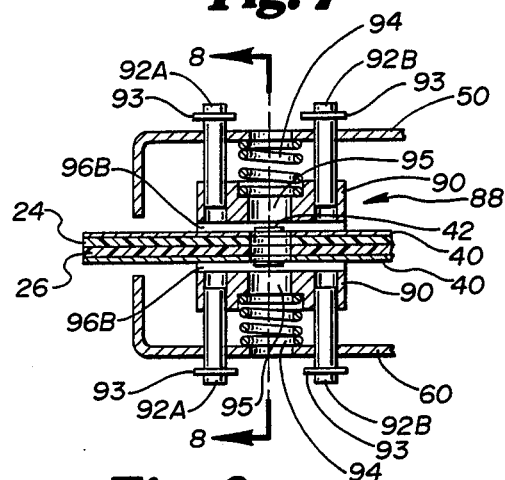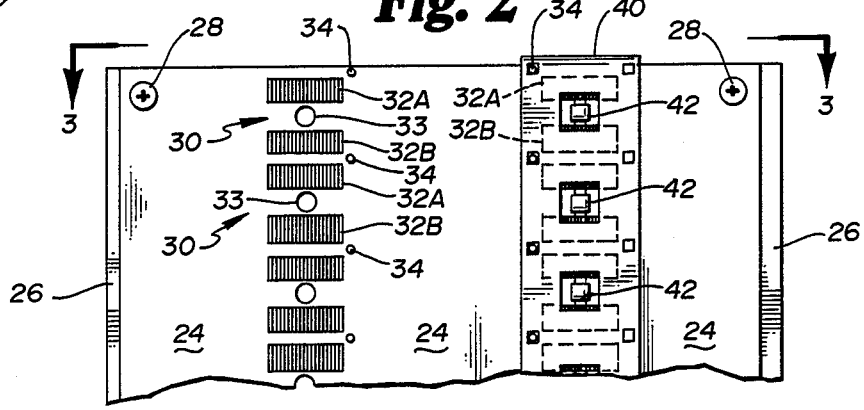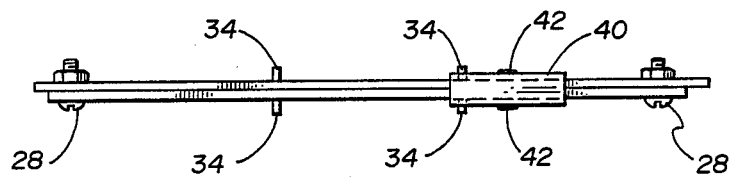

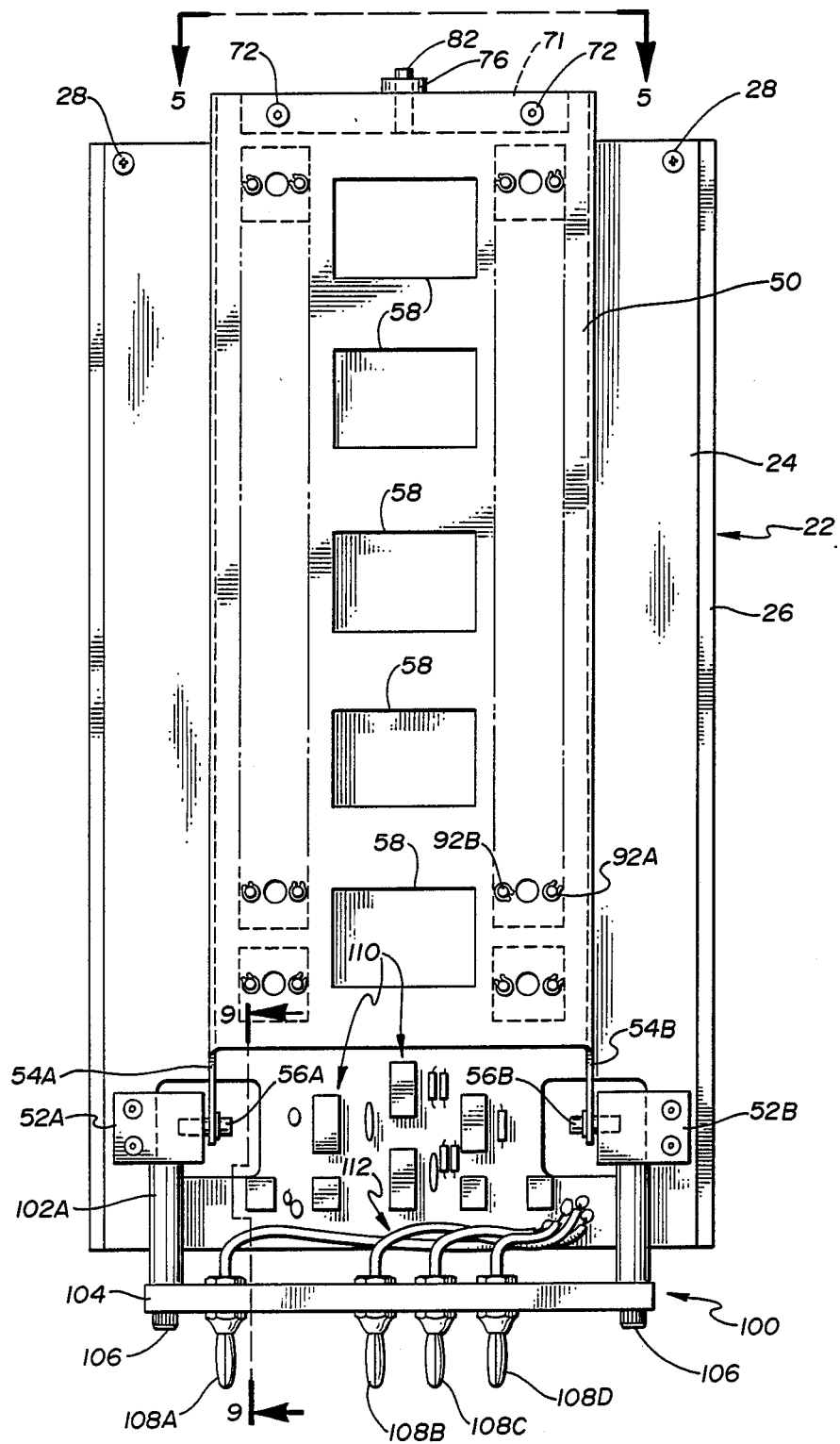
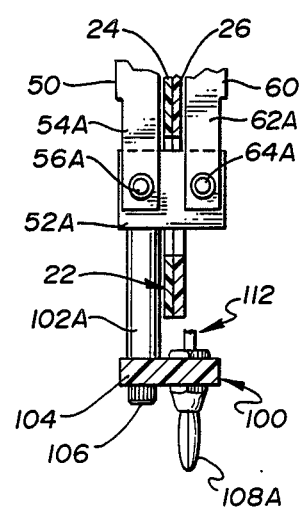
Fig. 4
Fig. 9

BURN-IN APPARATUS FOR INTEGRATED CIRCUITS MOUNTED ON A CARRIER TAPE

BACKGROUND OF THE INVENTION

1. Field of the Invention

The present invention relates generally to integrated circuit (IC) testing, and in particular is concerned with an apparatus for burn-in of integrated circuits mounted on a carrier tape.

2. Description of the Prior Art

A known method of bonding and packaging integrated circuits or chips is tape automated bonding or "TAB". In this method, chips are bonded to a carrier tape for form a supply. The tapes are stored on reels for use in automated operations in known manners.

Generally, the carrier tapes range in width from 8 mm. to 70 mm. and are multi-layered structures with an insulating film base and a conductive layer (typically gold-plated copper). Desired patterns are formed in the tape to define chip mounting locations on the tape. The conductive layer is patterned to define leads which will make contact with the chip and then fan out. An IC chip is positioned adjacent the mounting location so that chip contact pads are aligned with the leads. In a single operation, all pads are thermally bonded to their respective leads simultaneously.

The TAB process provides a convenient way of handling IC components in automated assembly operations. The webs of tape with mounted ICs may be wound as reels and may be transported to desired locations for testing and assembly and the like. Utilization of a TAB system provides an economical and reliable means of assembling, bonding, and handling integrated circuits.

It is common to perform "burn-in" of integrated circuit (IC) chips by subjecting the chips to elevated temperatures for an extended period of time while electrically exercising them. This may involve either dynamic or static exercising of the IC chips. The purpose of burn-in is to cause failure of those chips which would exhibit an unacceptably short life in normal operation. Any chip which fails during burn-in is weeded out as a reject during subsequent testing, after the chip has been removed from the burn-in environment.

In the past, this burn-in procedure has been performed by mounting the ICs in individual sockets of a burn-in circuit board. This has required, in the case of ICs mounted on tape using a TAB process, that the ICs be severed from the tape at the time of burn-in, and that the ICs be handled individually thereafter.

SUMMARY OF THE INVENTION

The present invention includes an apparatus for performing burn-in of integrated circuits mounted on a carrier tape, without having to sever them from the tape. The invention provides for quick and convenient installation and removal of the carrier tapes.

The apparatus includes a base having a plurality of contact arrays positioned to make electrical contact with the integrated circuits mounted on the tape. A cover is pivotally connected to the base and is movable between an open and a closed position. The cover includes a plurality of pressure pads which force contact between an integrated circuit and a contact array when a cover is closed. A locking assembly is provided to keep the cover closed during burn-in.

In preferred embodiments, a pair of covers are positioned on opposite sides of the base, and the tape is wrapped around the base so that burn-in of chips can take place on both sides of the base. The covers apply generally equal but opposite forces through pads to the chips on the base.

BRIEF DESCRIPTION OF THE DRAWINGS

FIG. 2 is a top view of a printed circuit (PC) board mounting assembly of the apparatus of FIG. 1.

FIG. 3 is a view taken along line 3—3 of FIG. 2.

FIG. 4 is a top view of the apparatus of FIG. 1 showing a front cover panel closed.

FIG. 5 is a view taken along line 5—5 of FIG. 4.

FIG. 6 is a sectional view taken along line 6—6 of FIG. 5.

FIG. 7 is a sectional view taken along line 7—7 of FIG. 6.

FIG. 8 is an enlarged sectional view taken along line 8—8 of FIG. 7.

FIG. 9 is an enlarged sectional view taken along line 9—9 of FIG. 4.

DETAILED DESCRIPTION OF THE PREFERRED EMBODIMENTS

Figure 1:
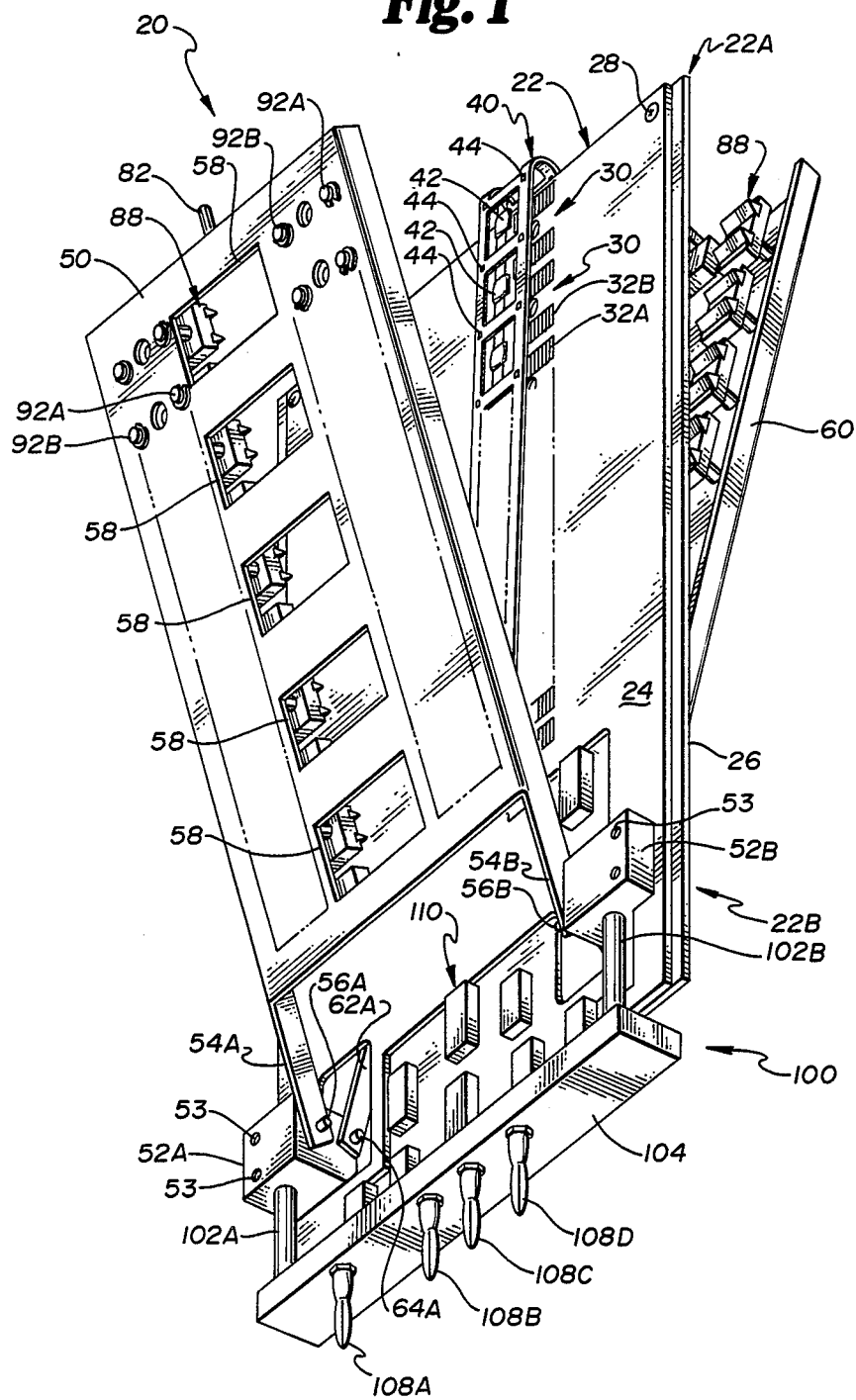
FIG. 1 is a perspective view of a burn-in apparatus constructed in accordance with the present invention.

A burn-in module 20 of the present invention is illustrated in the perspective view of FIG. 1. a printed circuit (PC) board base 22 is provided in the central portion of the burn-in module 20. The base 22 includes a first printed circuit board 24 and a second printed circuit board 26. The PC boards 24 and 26 are fastened together at a first end 22A of the base 22 by fasteners 28.

On the outer surfaces of each PC board 24 and 26, contact arrays 30 are arranged in a pair of columns. Each contact array 30 is formed by the two sets of contacts 32A and 32B. An opening 33 in base 22 is located between each set of contacts 32A and 32B. Adjacent each contact array 30 is a registration post 34. Registration posts 34 protrude slightly from the surface of the PC boards 24 and 26 and are aligned along the inner margin of each column of contact arrays 30.

As shown in FIGS. 1—3, carrier tape 40 having integrated circuits 42 attached are wrapped around the base 22. Each integrated circuit 42 is positioned above an opening 33 so that the sets of conductive leads from the integrated circuit 42 are positioned adjacent respective sets of contacts 32A and 32b. Opening 33 provides proper cooling of integrated circuit 42 during burn-in. The registration posts 34 are spaced to mate with sprocket holes 44 of tape 40 to ensure proper alignment of tape 40 with contact arrays 30.

A front cover panel 50 is pivotally connected to base 22. Windows 58 are provided near the central portion of the front cover panel 50. The front cover panel 50 is of sufficient length to extend slightly beyond the first end 22A of base 22 and of sufficient width to cover both columns of contact arrays 30.

At a second end 22B of base 22, the PC boards 24 and 26 are received within slots in hinge blocks 52A and 52B and fastened together by screws 53. the front cover panel 50 has a first leg 54A and a second leg 54B which are pivotally connected to hinge blocks 52A and 52B, respectively, by pins 56A and 56B.

In a likewise manner, a rear cover panel 60 is pivotally connected to base 22 on the opposite side of base 22 from the front cover panel 50. The rear cover panel 60 has a pair of legs 62A and 62B which are pivotally connected to hinge blocks 52A and 52B by pins 64A and 64B, respectively.

As best shown in FIGS. 5 and 6, a latch assembly 70 is provided on the burn-in module 20 to removably hold the front cover panel 50 and the rear cover panel 60 in close proximity to the PC board assembly 22. A front latch mount block 71 is connected to front cover panel 50 by screws 72. Likewise a rear pin mount block 74 is connected to the rear cover panel 60 by screws 75. A latch 76 is pivotally mounted to pivot pin 77 which is mounted to mount block 74. A latch pin 82 is provided on mount block 71 to catch latch 76. A helical spring 78 connected to spring standards 79A and 79B provides a bias force to latch 76 to keep it secure against the latch pin 82. A stop pin 80 is provided on latch 76 to engage mount block 74 to limit the range of motion of latch 76.

Along inner surfaces of the front and rear cover panels 50 and 60, a plurality of pressure pad assemblies 88 are provided. Each pressure pad assembly 88 is positioned opposite one of the contact arrays 30 of PC boards 24 and 26 when cover panels 50 and 60 are in their closed positions. As illustrated best in FIGS. 7 and 8, each pressure pad assembly 88 includes a guide block 90. A pair of guide shafts 92A and 92B are press fitted at first ends into the guide block 90. The second ends of guide shafts 92A and 92B extend through openings in the front and rear cover panels 50 and 60 so that the guide block 90 is movable in a direction perpendicular to the panel 50 or 60.

A snap ring 93 is mounted on the second end of each guide shaft 92A, 92B to prevent the shafts 92A, 92B from being separated from cover 50 or 60. A helical spring 94 is seated in a recess 95 in the mounting block 90. Spring 94 urges block 90 away from its respective panel 50 or 60.

As illustrated best in FIGS. 7 and 8, each guide block 90 carries a pair of elastomeric ribs 96A and 96B. The ribs 96A and 96B are spaced on opposite sides of the guide block 90 and press fitted into grooves 90A and 90B of the guide block 90. The ribs 96A and 96B apply the pressure to the leads from integrated circuits 42 to force them into contact with the corresponding contacts 32A and 32B. Because ribs 96A and 96B are an elastomeric insulating material, they do not short out the various leads which they engage and press against.

As best shown in FIGS. 1, 4 and 9, an electrical connection assembly 100 is connected to the second end 22B of PC board assembly 22. Posts 102A and 102B are connected to hinge blocks 52A and 52B, respectively. An insulation bar 104 is connected to the posts 102A and 102B by screws 106. Connector pins 108A–108D are mounted on the insulation bar 104 and are connected to circuitry 110 on PC boards 24 and 26 by wires 112. Electronic circuitry 110 is connected to the contact arrays 30 and controls and monitors the burn-in exercising of integrated circuits 42.

In use, a pair of carrier tapes 40 are wrapped, side-by-side, over PC boards 24 and 26 so that each integrated circuit 42 is aligned with a contact array 30. The front and rear cover panels 50 and 60 are pivoted about pivot pins 56A, 56B, 64a and 64B and closed onto the base 22. As the cover panels 50 and 60 are closed, the resiliently mounted pressure plate assemblies 88 come into contact with the tapes 40 wrapped over PC boards 24 and 26. The ribs 96A and 96B of each pressure pad assembly 88 press against the tape 40 on opposite sides of the integrated circuit 42. Springs 94 force the ribs 96A and 96B against the tape 40 to ensure contact between the leads of the integrated circuits and the corresponding contacts 32A and 32B of contact arrays 30.

The cover panels 50 and 60 are secured together by the latch assembly 70. Latch 76 is held closed against latch pin 82 by spring 78.

The burn-in module 20 is connected to a power supply through connector plugs 108A–108D and is placed into a chamber in which temperature can be controlled (and cycled) as required for burn-in.

With the burn-in board of the present invention, a burn-in procedure can be performed on integrated circuits which are mounted on tape (e.g. by the TAB process), by cutting the tape into suitable lengths corresponding to the number of matching contact arrays 32 provided on base 22. This greatly simplifies post burn-in handling of the ICs. The segments of tape can easily be spliced back together and the ICs and tape stored again in a reel.

The present invention is capable of applying significant force to the tapes to ensure that contact is maintained throughout the burn-in process. The symmetrical arrangement of cover panels 50 and 60 makes the application of clamping forces equal and opposite.

Although the present invention has been described with reference to preferred embodiments, workers skilled in the art will recognize that changes may be made in form and detail without departing from the spirit and scope of the invention.

What is claimed is:

1. An apparatus for electrically and thermally burning in a plurality of integrated circuits mounted at spaced intervals on a carrier tape, each integrated circuit having a set of conductive leads extending outward and generally parallel to the carrier tape, the apparatus comprising:

a base having first and second generally parallel support surfaces for supporting the carrier tape during testing;

a first set of electrical contact arrays on the first support surface of the base, each arrays positioned for making electrical contact with leads from one of the integrated circuits mounted on the carrier tape;

a second set of electrical contact arrays on the second support surface of the base, each array positioned for making electrical contact with leads from one of the integrated circuits mounted on the carrier tape;

a first cover pivotally connected to the base and extending over the first set of electrical contact arrays on the first support surface when the first cover is in a closed position;

a second cover pivotally connected to the base and extending over the second set of electrical contact arrays on the second support surface when the second cover is in a closed position;

first pressure applying means carried by the first cover for urging the set of leads of each of the integrated circuits located adjacent the first support surface into contact with one of the first set of electrical contact arrays when the first cover is in its closed position;

second pressure applying means carried by the second cover for urging the set of leads of each of the integrated circuits located adjacent the second support surface into contact with one of the second set of electrical contact arrays when the second cover is in its closed position;

locking means for selectively locking the first and second covers in the closed position; and means connected to the first and second sets of electrical contact arrays for testing the integrated circuits.

2. The apparatus of claim 1 wherein the locking means comprises a latch assembly comprising a spring-loaded latch pivotally connected to the first cover and a latch pin connected to the second cover.

3. The apparatus of claim 1 and further comprising first and second sets of locating posts protruding from the first and second support surfaces of the base adjacent the first and second sets of contact arrays, respectively, for engaging sprocket openings in the carrier tape.

4. The apparatus of claim 1 wherein the first and second sets of contact arrays are aligned in columns, and the columns are aligned generally parallel to each other.

5. The apparatus of claim 4 wherein the first and second pressure applying means comprise first and second sets of pressure pad assemblies, each assembly positioned to be aligned with one of the contact arrays when the cover which carries that assembly is in its closed position to independently urge the leads of one of the integrated circuits into contact with one of the contact arrays.

6. The apparatus of claim 5 wherein each of the pressure pad assemblies has an opening therethrough which is adjacent and generally aligned with one of the integrated circuits when the carrier tape is in position and the pressure pad assembly is applying pressure to the set of leads of that integrated circuit.

7. The apparatus of claim 5 wherein each pressure pad assembly includes a guide block movably mounted on the cover which carries that assembly and spring means for urging the guide block away from the cover which carries that assembly and toward the base.

8. The apparatus of claim 7 wherein the pressure pad assembly includes a spaced pair of electrically insulating ribs, whereby the ribs press against the leads on opposite sides of an integrated circuit when the cover which carries that assembly is in its closed position.

9. The apparatus of claim 8 wherein the insulating ribs are constructed from an elastomeric material.

10. The apparatus of claim 1 wherein the base has a plurality of openings therein, each opening being adjacent and generally aligned with one of the integrated circuits when the carrier tape is being supported by the base.

11. The apparatus of claim 1 wherein the base has a thickness which permits the carrier tape to be positioned over the first support surface, wrapped around an end of the base, and over the second support surface, the thickness of the base being smaller than the spaced intervals between integrated circuits on the carrier tape.

* * * * *